(12) United States Patent
Jacobs

(10) Patent No.: US 6,475,570 B2
(45) Date of Patent: Nov. 5, 2002

(54) DILUENT ASSISTED LUBRICATION OF MICROMECHANICAL DEVICES

(75) Inventor: Simon Joshua Jacobs, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/036,611

(22) Filed: Dec. 31, 2001

(65) Prior Publication Data

US 2002/0086101 A1 Jul. 4, 2002

Related U.S. Application Data

(60) Provisional application No. 60/258,995, filed on Dec. 29, 2000.

(51) Int. Cl.$^7$ .................................................. B05D 1/02
(52) U.S. Cl. ........................... 427/421; 427/58; 427/96; 427/255.25; 427/255.3
(58) Field of Search ........................... 427/421, 58, 96, 427/255.25, 255.3

(56) References Cited

U.S. PATENT DOCUMENTS

| | | |
|---|---|---|
| 5,061,049 A | 10/1991 | Hornbeck |
| 5,583,688 A | 12/1996 | Hornbeck |
| 6,300,294 B1 | 10/2001 | Robbins et al. |
| 6,365,229 B1 | 4/2002 | Robbins |

Primary Examiner—Bernard Pianalto
(74) Attorney, Agent, or Firm—Charles A. Brill; Wade James Brady, III; Frederick J. Telecky, Jr.

(57) ABSTRACT

A method and apparatus for delivering a fine mist of a lubricant to a micromechanical device. A mixture 402 of a lubricant and a diluent carrier fluid is held in a supply reservoir 404. The mixture is forced through a nebulizer tip 406 to produce a fine aerosol. A particle selector 408 removes large droplets from the aerosol as the aerosol passes. The aerosol travels a distance through a delivery conduit 410 while the diluent carrier fluid evaporates from the nebulized droplets. The evaporation removes the vast majority of the diluent carrier fluid from the droplets, greatly reducing the size of the lubricant droplets. The evaporated aerosol enters a deposition chamber 412 and is deposited on a micromechanical device 414. The micromechanical devices may be lubricated in wafer form, in which case the lubricant aerosol will lubricate an entire wafer of micromechanical devices at one time. One embodiment produces an aerosol having a mean droplet size of less than 10 microns. Evaporation of the diluent carrier fluid reduces this droplet size to 10–500 nm by the time the lubricant is deposited on the micromechanical devices. The preceding abstract is submitted with the understanding that it only will be used to assist in determining, from a cursory inspection, the nature and gist of the technical disclosure as described in 37 C.F.R. §1.72(b). In no case should this abstract be used for interpreting the scope of any patent claims.

45 Claims, 3 Drawing Sheets

DILUENT ASSISTED LUBRICATION OF MICROMECHANICAL DEVICES

This application claims priority under 35 USC §119(e)(1) of provisional application No. 60/258,995 filed Dec. 29, 2000.

CROSS-REFERENCE TO RELATED APPLICATIONS

The following patents and/or commonly assigned patent applications are hereby incorporated herein by reference:

| Patent No. | Filing Date | Issue Date | Title |
| --- | --- | --- | --- |
| 5,061,049 | Sept. 13, 1990 | Oct. 29, 1991 | Spatial Light Modulator and Method |
| 5,583,688 | Dec. 21, 1993 | Dec. 10, 1996 | Multi-Level Digital Micromirror Device |

FIELD OF THE INVENTION

This invention relates to the field of microelectromechanical systems (MEMS), more particularly to methods of lubricating micromechanical devices.

BACKGROUND OF THE INVENTION

Micromechanical devices are small structures typically fabricated on a semiconductor wafer using techniques such as optical lithography, doping, metal sputtering, oxide deposition, and plasma etching which have been developed for the fabrication of integrated circuits.

Micromirror devices are a type of micromechanical device. Other types of micromechanical devices include accelerometers, pressure and flow sensors, gears and motors. While some micromechanical devices, such as pressure sensors, flow sensors, and micromirrors have found commercial success, other types have not yet been commercially viable.

Micromechanical devices typically have components that move and contact or rub other parts. Because of the extremely small forces used to move these parts, it is sometimes difficult to overcome the forces resisting the motion of the part. These forces, often called stiction forces, include friction, intermolecular attractive forces such as van der Waals force, and capillary forces created by liquids on the surfaces of the device.

Several techniques help to overcome these stiction forces. Micromechanical device packages typically are hermetically sealed to prevent water vapor and other fluids from entering the package and creating capillary forces. Dissimilar metals and coatings are used to reduce the intermolecular forces. Lubricants, such as perfluorodecanoic acid (PFDA) are also applied to the micromechanical devices to reduce stiction. Lubricants, however, are very difficult to deliver to the surface of a micromechanical device since large quantities of the liquid will dewet the surface of the micromechanical device and may create capillary forces capable of destroying the device. What is needed is a method and apparatus for applying a lubricant to the surface of a micromechanical device that does not destroy the fragile structures of the micromechanical device.

SUMMARY OF THE INVENTION

Objects and advantages will be obvious, and will in part appear hereinafter and will be accomplished by the present invention which provides a method and apparatus for applying a lubricant to the surface of a micromechanical device without destroying the fragile structures of the micromechanical device. One embodiment of the invention provides a method of coating the surfaces of a micromechanical device. The method comprising: mixing a coating material with a carrier fluid; nebulizing the mixture to form an aerosol of droplets of the mixture; evaporating a majority of the carrier fluid from the aerosol; exposing the micromechanical device to the evaporated aerosol; and depositing the evaporated droplets of coating material on said micromechanical device.

Another embodiment of the invention provides a method of coating the surfaces of a micromechanical device. The method comprising: mixing a coating material selected from the group consisting of perfluoropolyethers, fluorocarbon oligomers, perfluorinated carboxylic acids, partially fluorinated carboxylic acids, and perfluorodecanoic acid with a carrier fluid selected from the group consisting of perfluorocarbon and hydrofluoroether; nebulizing the mixture to form an aerosol of droplets of the mixture; evaporating a majority of the carrier fluid from the aerosol; exposing the micromechanical device to the evaporated aerosol; and depositing the evaporated droplets of coating material on the micromechanical device.

Another embodiment of the invention provides a method of coating the surfaces of a micromechanical device. The method comprising: mixing a coating material with a carrier fluid selected from the group consisting of perfluorocarbon and hydrofluoroether; nebulizing the mixture to form an aerosol of droplets of the mixture; evaporating a majority of the carrier fluid from the aerosol; exposing the micromechanical device to the evaporated aerosol; and depositing the evaporated droplets of coating material on the micromechanical device.

Another embodiment of the invention provides a method of coating the surfaces of a micromechanical device. The method comprising: mixing a coating material selected from the group consisting of perfluoropolyethers, fluorocarbon oligomers, perfluorinated carboxylic acids, partially fluorinated carboxylic acids, and perfluorodecanoic acid with a carrier fluid; nebulizing the mixture to form an aerosol of droplets of the mixture; evaporating a majority of the carrier fluid from the aerosol; exposing the micromechanical device to the evaporated aerosol; and depositing the evaporated droplets of coating material on the micromechanical device.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

A method and apparatus for applying a lubricant to the surfaces of a micromechanical device has been developed.

The method allows the delivery of lubricant to all surfaces of the micromechanical device while preventing excess delivery which can cause dewetting and destruction of the device. The method and apparatus use an evaporating diluent to provide extremely small droplets of the lubricant to the surfaces of the micromechanical device.

A mist of extremely small particles is necessary both to prevent potentially damaging droplets from forming on the surface of the devices and also to enable the lubricant to coat all surfaces of the device. For example, as described in detail below, micromirror devices have an array of large mirrors with very small gaps between each mirror. The lubricant must be deposited on surfaces underneath the mirror—including the bottom surface of the mirror itself Large particles of lubricant will not properly lubricate devices such as micromirrors.

Figure 1:
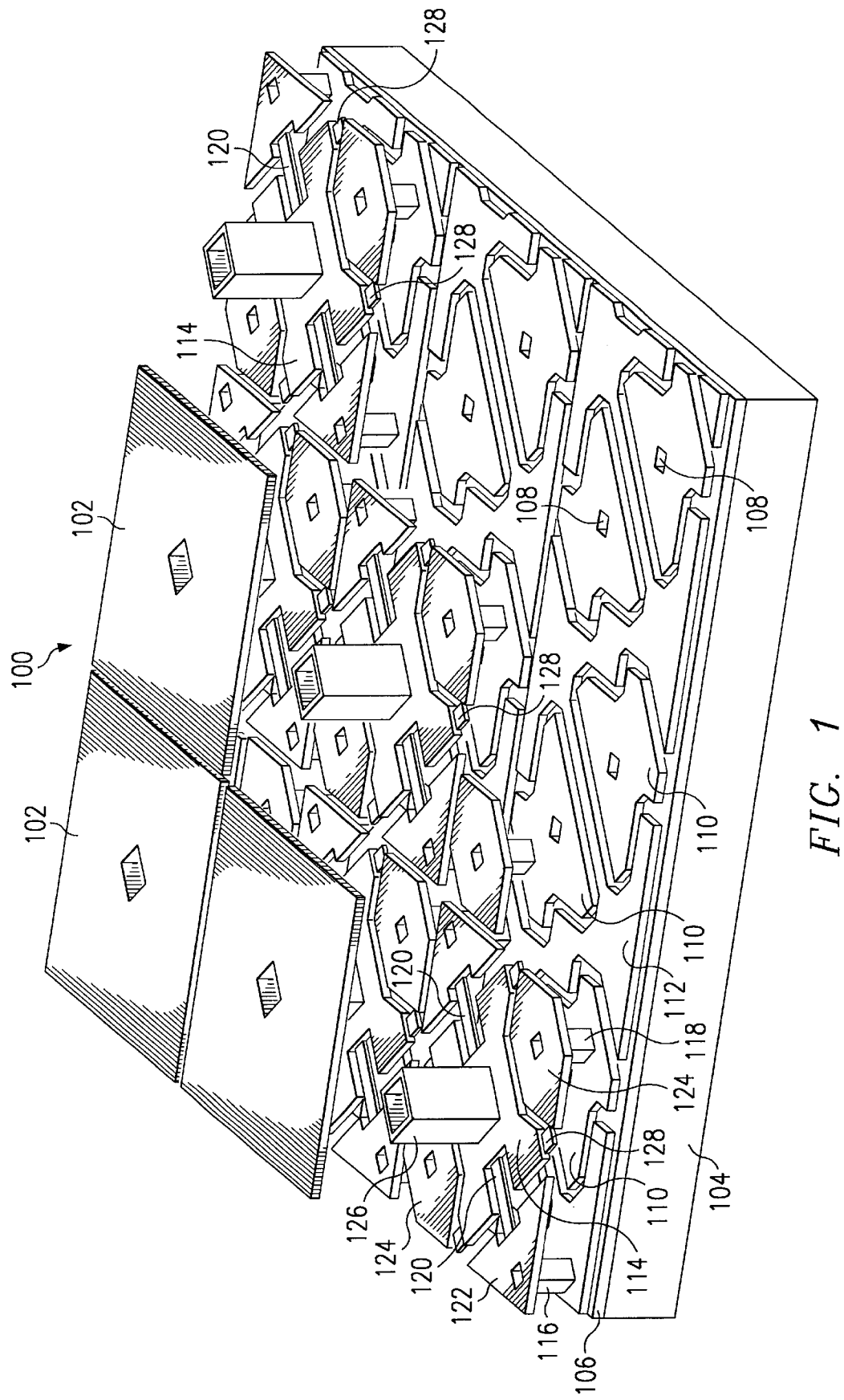
FIG. 1 is a perspective view of a small portion of a micromirror array of the prior art.
Figure 2:
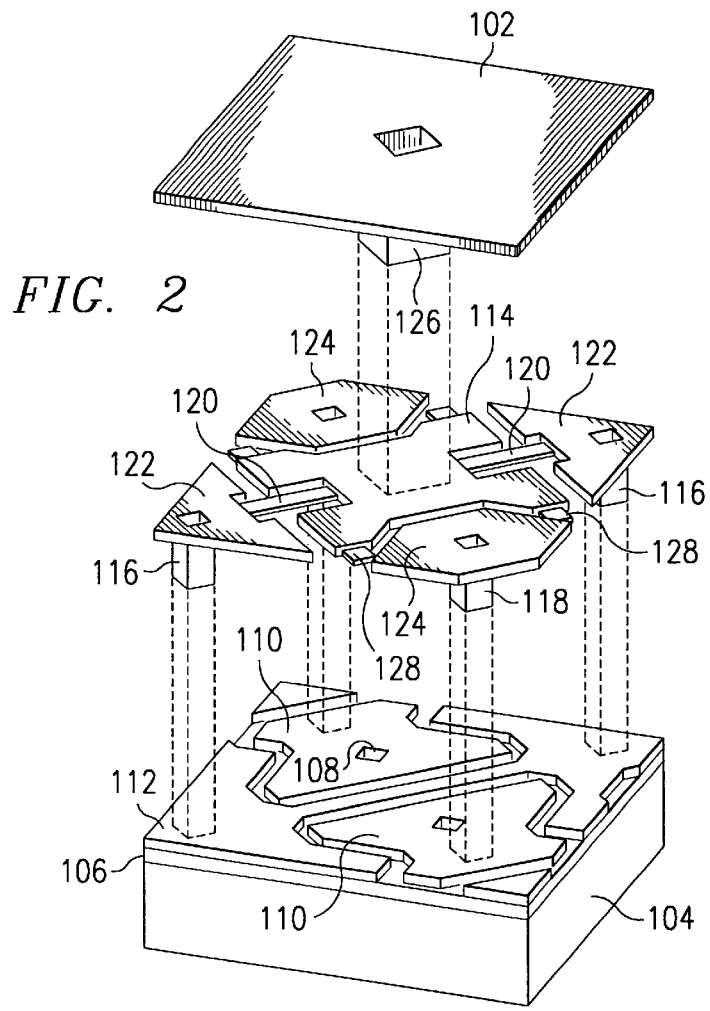
FIG. 2 is an exploded perspective view of a single micromirror element from the micromirror array of FIG. 1.

A typical hidden-hinge micromirror 100 is actually an orthogonal array of micromirror cells, or elements. This array often includes more than a thousand rows and columns of micromirrors. FIG. 1 shows a small portion of a micromirror array of the prior art with several mirrors 102 removed to show the underlying mechanical structure of the micromirror array. FIG. 2 is an exploded view of a single micromirror element of the prior art further detailing the relationships between the micromirror structures.

A micromirror is fabricated on a semiconductor, typically silicon, substrate 104. Electrical control circuitry is typically fabricated in or on the surface of the semiconductor substrate 104 using standard integrated circuit process flows. The silicon substrate 104 and any necessary metal interconnection layers are isolated from the micromirror superstructure by an insulating layer 106 which is typically a deposited silicon dioxide layer on which the micromirror superstructure is formed. Holes, or vias, are opened in the oxide layer to allow electrical connection of the micromirror superstructure with the electronic circuitry formed in the substrate 104.

Address electrodes 110 and a mirror bias connection 112 are formed from a metal layer deposited on the insulating layer 106. Some micromirror designs have separate and distinct landing electrodes which are electrically connected to the mirror bias connection 112. Landing electrodes limit the rotation of the mirror 102 and prevent the rotated mirror 102 or hinge yoke 114 from touching the address electrodes 110, which have a voltage potential relative to the mirror 102. If the mirror 102 contacts the address electrodes 110, the resulting short circuit could fuse the torsion hinges 120 or weld the mirror 102 to the address electrodes 110, in either case ruining the micromirror. Since the same voltage is always applied to both the landing electrodes and the mirrors 102, the mirror bias connection and the landing electrodes are combined in a single structure when possible. The landing electrodes are combined with the mirror bias connection 112 by including regions on the mirror bias/reset connection 112, called landing sites, which mechanically limit the rotation of the mirror 102 by contacting either the mirror 102 or the torsion hinge yoke 114. These landing sites are often coated with a material chosen to reduce the tendency of the mirror 102 and torsion hinge yoke 114 to stick to the landing site.

Hinge support spacervias 116 and upper address electrode spacervias 118, typically extend approximately 1 μm above the address electrodes 110 and mirror bias connections 112. A hinge cap 122 and upper address electrodes 124 are supported by the hinge support spacervias 116 and upper address electrode spacervias 118. The hinge cap 122 anchors the ends of torsion hinges 120. A hinge yoke 114 is formed between and supported by the torsion hinges 120. The hinge yoke 114 is allowed to rotate by twisting the thin torsion hinges 120. A mirror support spacervia 126 is formed on the hinge yoke, and supports a mirror 102 approximately 2 μm above the hinge yoke 114. The mirror typically is a square between 12 and 17 μm on each side, with gaps between the mirrors of 1 μm or less.

Electrostatic attraction between an address electrode 110 and a deflectable rigid member, which in effect form the two plates of an air gap capacitor, is used to rotate the mirror structure. The rotation is stopped by contact between the deflectable rigid member and a stationary member—typically between spring tips extending from the hinge yoke and landing sites on the mirror bias connection. As described above, these features typically are coated with a lubricant to reduce stiction and allow the deflected mirror to release from the landing site when the electrostatic force is removed. Because these features are hidden underneath the micromirrors, they are very difficult to coat without applying too much lubricant to the exposed portions of the device.

Figure 3:
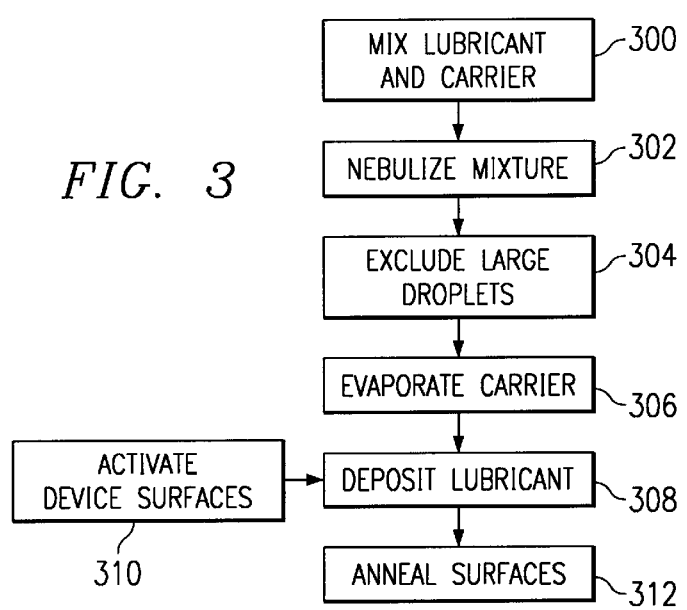
FIG. 3 is a block diagram of one embodiment of a lubrication process according to the present invention.

FIG. 3 is a block diagram of one embodiment of a lubrication process according to the present invention. In FIG. 3, a lubricant and a suitable carrier are mixed 300. Suitable lubricants include perfluoropolyethers (PFPEs), fluorocarbon oligomers, perfluorinated carboxylic acids, partially fluorinated carboxylic acids.

Suitable carriers include perfluorocarbon, hydrofluoroether, and other volatile organic liquids. The carrier should mix well in the desired proportion with chosen lubricant, and ideally will have a high vapor pressure at room temperature.

Because the carrier is used to provide very small droplets of the lubricant, the mixture generally contains much more of the carrier than of the lubricant by weight. Typical mixtures are 25% by weight of the lubricant, down to the most dilute solution practical, roughly one part per million (ppm) of lubricant. The proportions, as well as the type of lubricant and carrier selected, determine the deposition times achievable using the described technique—which can easily range from a few seconds to several minutes.

The lubricant and carrier mixture is nebulized 302, typically by feeding the mixture through a nebulizing tip. The nebulization 302 creates an aerosol. Typical nebulization tips provide an aerosol having a mean particle diameter of less than 10 microns.

Several mechanisms may be used to provide the aerosol mixture. The mixture may be pressurized and fed through the nebulizing tip. Alternatively, a suction-type air gun may be used to nebulize the mixture. Other embodiments use inkjet-type dispensers to provide droplets of the mixture.

An optional size selecting apparatus excludes large droplets from the aerosol stream 304. This optional apparatus may use air streams, electrostatic attraction, or other means to separate the large droplets and exclude them from the deposition chamber. One simple mechanism to exclude the large droplets is to force the aerosol to travel a long distance to the deposition chamber. This large distance allows the larger droplets to settle out of the aerosol stream.

After the mixture is nebulized, the carrier is allowed to evaporate out of the droplets 306. As the carrier evaporates, the droplet size is reduced. Ideally, all of the carrier, or a vast majority of the carrier, is evaporated out of the droplet. The evaporation of the diluent results in much smaller lubricant particle sizes, on the order of 10 to 500 nm. The high vapor pressure of the carrier assists this evaporation. The evaporation can also be encouraged by heating the aerosol stream, although a heated aerosol may encourage condensation of the lubricant and carrier on a cooler micromechanical device substrate.

After the carrier is evaporated from the droplets of lubricant, the remaining lubricant is deposited on the micromechanical devices on the target wafer 308. The small lubricant droplets easily diffuse around the elements of the micromechanical device, for example through the gaps between micromirrors. The small lubricant droplets are smaller than the critical dewetting diameter of the lubricant, resulting in a uniform thin film of lubricant deposited on all surfaces of the micromechanical device.

The nebulization and evaporation process described above enables the room temperature delivery of a gas phase atmosphere of lubricants that are solids at room temperature. For example, a monolayer of perfluorodecanoic acid, a well know micromirror lubricant, may be deposited using a perfluorocarbon diluent carrier fluid. This eliminates the need for the heated deposition chambers and apparatus that previously were required. Since the lubricant need not be heated, there is less risk of the lubricant condensing out of the vapor onto the micromechanical device.

Prior to the deposition of the lubricant onto the micromechanical device, the surfaces of the device optionally may be activated 310 to enhance the bond between the lubricant and the microstructures. Typical activation involves exposure to a fluorinated vapor or plasma.

After the lubrication is deposited, an optional anneal process 312 may be used. The anneal process heats the device to promote spreading of the lubricant. The anneal process assists bonding between the lubricant and the device by removing volatile contaminants. A getter may be used to enhance the anneal process by gettering the volatile contaminants, such as water, that are released during the anneal process.

Figure 4:
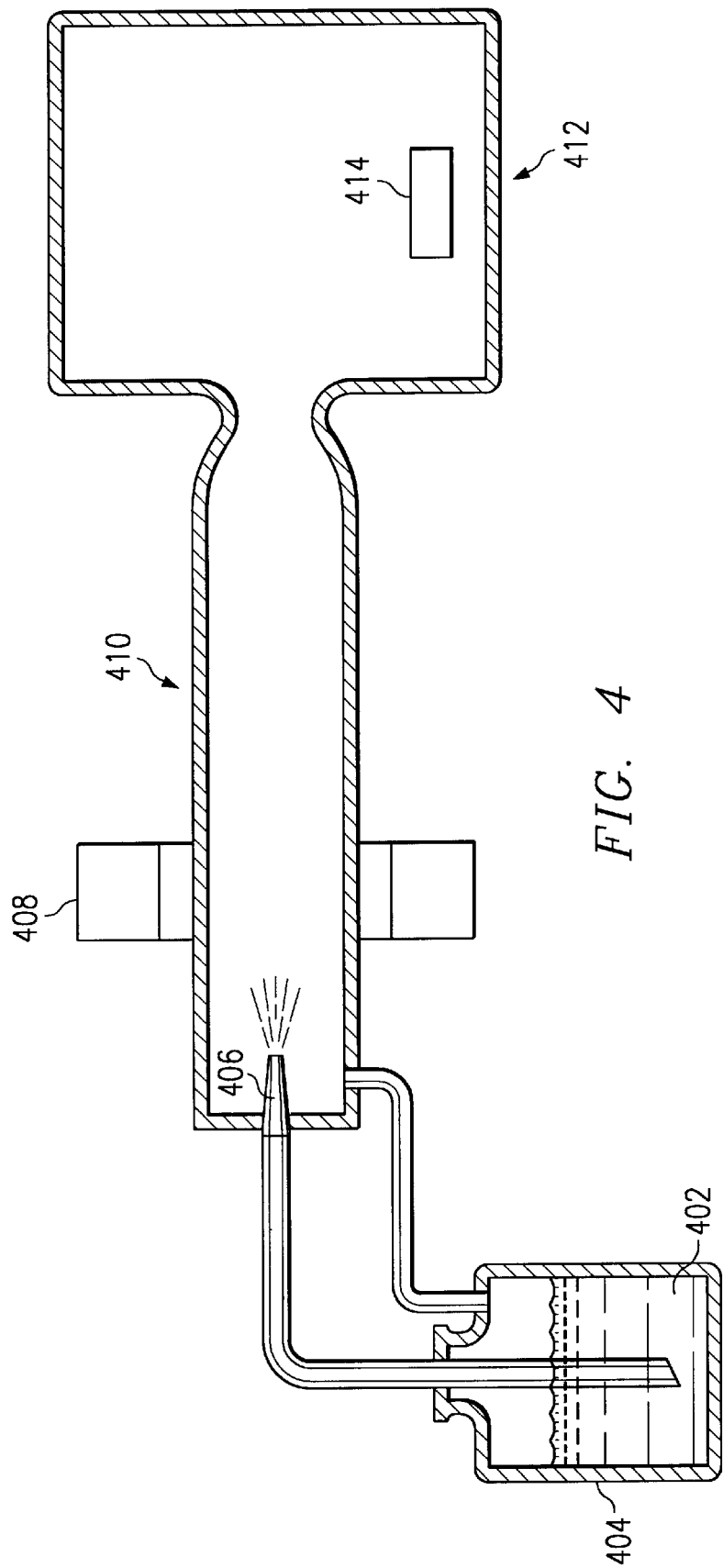
FIG. 4 is a schematic diagram of one embodiment of a lubrication apparatus according to the present invention.

FIG. 4 is a schematic diagram of one apparatus used to perform the diluent assisted lubricant deposition described above. In FIG. 4, a mixture 402 of a lubricant and a diluent carrier fluid is held in a supply reservoir 404. The mixture is forced through a nebulizer tip 406 to produce a fine aerosol. A particle selector 408 removes large droplets from the aerosol as the aerosol passes. The aerosol travels a distance through a delivery conduit 410 while the diluent carrier fluid evaporates from the nebulized droplets. The evaporation removes the vast majority of the diluent carrier fluid from the droplets, greatly reducing the size of the lubricant droplets. The evaporated aerosol enters a deposition chamber 412 and is deposited on a micromechanical device 414. The micromechanical devices may be lubricated in wafer form, in which case the lubricant aerosol will lubricate an entire wafer of micromechanical devices at one time. One embodiment produces an aerosol having a mean droplet size of less than 10 microns. Evaporation of the diluent carrier fluid reduces this droplet size to 10–500 nm by the time the lubricant is deposited on the micromechanical devices.

Thus, although there has been disclosed to this point a particular embodiment of a method and apparatus for applying a lubricant to the surface of a micromechanical device without destroying the fragile structures of the micromechanical device, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims. In the following claims, only elements denoted by the words "means for" are intended to be interpreted as means plus function claims under 35 U.S.C. §112, paragraph six.

What is claimed is:

1. A method of coating the surfaces of a micromechanical device, the method comprising:

mixing a coating material with a carrier fluid;

nebulizing said mixture to form an aerosol of droplets of said mixture;

evaporating a majority of said carrier fluid from said aerosol;

exposing said micromechanical device to said evaporated aerosol; and depositing said evaporated droplets of coating material on said micromechanical device.

2. The method of claim 1, said mixing comprising:

mixing a coating material with a carrier fluid to obtain a mixture no more than 25% by weight of said coating material.

3. The method of claim 1, said mixing comprising:

mixing a coating material with a carrier fluid to obtain a mixture no more than 1 part per million by weight of said coating material.

4. The method of claim 1, said mixing comprising:

mixing a coating material selected from the group consisting of perfluoropolyethers, fluorocarbon oligomers, perfluorinated carboxylic acids, partially fluorinated carboxylic acids, and perfluorodecanoic acid with a carrier fluid.

5. The method of claim 1, said mixing comprising:

mixing a coating material with a carrier fluid selected from the group consisting of perfluorocarbon and hydrofluoroether.

6. The method of claim 1, said mixing comprising:

mixing a coating material with a volatile organic liquid.

7. The method of claim 1, comprising:

removing large droplets from said aerosol.

8. The method of claim 1, comprising:

allowing large droplets of said aerosol to settle out of said aerosol away from said micromechanical device.

9. The method of claim 1, said nebulizing comprising:

nebulizing said mixture to form an aerosol of droplets of said mixture having a mean particle diameter less than 10 microns.

10. The method of claim 1, said evaporating comprising:

evaporating a majority of said carrier fluid from said aerosol to leave an aerosol of droplets having a mean particle diameter less than 500 nm.

11. The method of claim 1, said evaporating comprising:

evaporating a majority of said carrier fluid from said aerosol to leave an aerosol of droplets having a mean particle diameter between 10 and 500 nm.

12. The method of claim 1, said evaporating comprising:

evaporating a majority of said carrier fluid from said aerosol to leave an aerosol of droplets having a particle diameter less than 500 nm.

13. The method of claim 1, said evaporating comprising:

evaporating all of said carrier fluid from said aerosol.

14. A method of coating the surfaces of a micromechanical device, the method comprising:

mixing a coating material selected from the group consisting of perfluoropolyethers, fluorocarbon oligomers, perfluorinated carboxylic acids, partially fluorinated carboxylic acids, and perfluorodecanoic acid with a carrier fluid selected from the group consisting of perfluorocarbon and hydrofluoroether;

nebulizing said mixture to form an aerosol of droplets of said mixture;

evaporating a majority of said carrier fluid from said aerosol;

exposing said micromechanical device to said evaporated aerosol; and depositing said evaporated droplets of coating material on said micromechanical device.

15. The method of claim 14, said mixing comprising:
mixing a coating material with a carrier fluid to obtain a mixture no more than 25% by weight of said coating material.

16. The method of claim 14, said mixing comprising:
mixing a coating material with a carrier fluid to obtain a mixture no more than 1 part per million by weight of said coating material.

17. The method of claim 14, said evaporating comprising:
evaporating all of said carrier fluid from said aerosol.

18. The method of claim 14, comprising:
removing large droplets from said aerosol.

19. The method of claim 14, comprising:
allowing large droplets of said aerosol to settle out of said aerosol away from said micromechanical device.

20. The method of claim 14, said nebulizing comprising:
nebulizing said mixture to form an aerosol of droplets of said mixture having a mean particle diameter less than 10 microns.

21. The method of claim 14, said evaporating comprising:
evaporating a majority of said carrier fluid from said aerosol to leave an aerosol of droplets having a mean particle diameter less than 500 nm.

22. The method of claim 14, said evaporating comprising:
evaporating a majority of said carrier fluid from said aerosol to leave an aerosol of droplets having a mean particle diameter between 10 and 500 nm.

23. The method of claim 14, said evaporating comprising:
evaporating a majority of said carrier fluid from said aerosol to leave an aerosol of droplets having a particle diameter less than 500 nm.

24. The method of claim 14, said evaporating comprising:
evaporating all of said carrier fluid from said aerosol.

25. A method of coating the surfaces of a micromechanical device, the method comprising:
mixing a coating material with a carrier fluid selected from the group consisting of perfluorocarbon and hydrofluoroether;

nebulizing said mixture to form an aerosol of droplets of said mixture;

evaporating a majority of said carrier fluid from said aerosol;

exposing said micromechanical device to said evaporated aerosol; and depositing said evaporated droplets of coating material on said micromechanical device.

26. The method of claim 25, said mixing comprising:
mixing a coating material with a carrier fluid to obtain a mixture no more than 25% by weight of said coating material.

27. The method of claim 25, said mixing comprising:
mixing a coating material with a carrier fluid to obtain a mixture no more than 1 part per million by weight of said coating material.

28. The method of claim 25, comprising:
removing large droplets from said aerosol.

29. The method of claim 25, comprising:
allowing large droplets of said aerosol to settle out of said aerosol away from said micromechanical device.

30. The method of claim 25, said nebulizing comprising:
nebulizing said mixture to form an aerosol of droplets of said mixture having a mean particle diameter less than 10 microns.

31. The method of claim 25, said evaporating comprising:
evaporating a majority of said carrier fluid from said aerosol to leave an aerosol of droplets having a mean particle diameter less than 500 nm.

32. The method of claim 25, said evaporating comprising:
evaporating a majority of said carrier fluid from said aerosol to leave an aerosol of droplets having a mean particle diameter between 10 and 500 nm.

33. The method of claim 25, said evaporating comprising:
evaporating a majority of said carrier fluid from said aerosol to leave an aerosol of droplets having a particle diameter less than 500 nm.

34. The method of claim 25, said evaporating comprising:
evaporating all of said carrier fluid from said aerosol.

35. A method of coating the surfaces of a micromechanical device, the method comprising:
mixing a coating material selected from the group consisting of perfluoropolyethers, fluorocarbon oligomers, perfluorinated carboxylic acids, partially fluorinated carboxylic acids, and perfluorodecanoic acid with a carrier fluid;

nebulizing said mixture to form an aerosol of droplets of said mixture;

evaporating a majority of said carrier fluid from said aerosol;

exposing said micromechanical device to said evaporated aerosol; and depositing said evaporated droplets of coating material on said micromechanical device.

36. The method of claim 35, said mixing comprising:
mixing a coating material with a carrier fluid to obtain a mixture no more than 25% by weight of said coating material.

37. The method of claim 35, said mixing comprising:
mixing a coating material with a carrier fluid to obtain a mixture no more than 1 part per million by weight of said coating material.

38. The method of claim 35, said mixing comprising:
mixing a coating material with a volatile organic liquid.

39. The method of claim 35, comprising:
removing large droplets from said aerosol.

40. The method of claim 35, comprising:
allowing large droplets of said aerosol to settle out of said aerosol away from said micromechanical device.

41. The method of claim 35, said nebulizing comprising:
nebulizing said mixture to form an aerosol of droplets of said mixture having a mean particle diameter less than 10 microns.

42. The method of claim 35, said evaporating comprising:
evaporating a majority of said carrier fluid from said aerosol to leave an aerosol of droplets having a mean particle diameter less than 500 nm.

43. The method of claim 35, said evaporating comprising:
evaporating a majority of said carrier fluid from said aerosol to leave an aerosol of droplets having a mean particle diameter between 10 and 500 nm.

44. The method of claim 35, said evaporating comprising:
evaporating a majority of said carrier fluid from said aerosol to leave an aerosol of droplets having a particle diameter less than 500 nm.

45. The method of claim 35, said evaporating comprising:
evaporating all of said carrier fluid from said aerosol.

* * * * *